(12) United States Patent
Ye

(10) Patent No.: US 10,545,373 B2
(45) Date of Patent: Jan. 28, 2020

(54) BACKLIGHT MODULE AND LIQUID CRYSTAL DISPLAY DEVICE

(71) Applicant: BOE TECHNOLOGY GROUP CO., LTD., Beijing (CN)

(72) Inventor: Huiqiang Ye, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/106,676

(22) Filed: Aug. 21, 2018

(65) Prior Publication Data

US 2019/0302528 A1 Oct. 3, 2019

(30) Foreign Application Priority Data

Apr. 2, 2018 (CN) .................... 2018 2 0453224 U

(51) Int. Cl.
*G02F 1/1335* (2006.01)
*F21V 8/00* (2006.01)
*G02F 1/1345* (2006.01)
*G02F 1/1333* (2006.01)
*H05K 1/18* (2006.01)

(52) U.S. Cl.
CPC ..... *G02F 1/133603* (2013.01); *G02B 6/0031* (2013.01); *G02B 6/0051* (2013.01); *G02B 6/0053* (2013.01); *G02F 1/13452* (2013.01); *G02F 1/133308* (2013.01); *G02F 1/133509* (2013.01); *H05K 1/189* (2013.01)

(58) Field of Classification Search
CPC ........... G02F 1/133603; G02F 1/13452; G02F 1/133308; G02F 1/133509; G02F 1/1336; G02F 1/133602; G02F 1/133604–133609; G02F 1/133611; G02F 1/133615; G02F 1/133617; G02F 1/13362; G02F 1/133621; G02F 1/13363; G02F 1/133632; G02B 6/0053; G02B 6/0031; G02B 6/0051; H05K 1/189
See application file for complete search history.

(56) References Cited

U.S. PATENT DOCUMENTS

| | | | | |
|---|---|---|---|---|
| 2012/0106122 A1* | 5/2012 | Ryu | .................. | G02F 1/133608 362/19 |
| 2012/0307175 A1* | 12/2012 | Zhou | ..................... | G02B 6/009 349/61 |
| 2013/0044279 A1* | 2/2013 | Kuo | ..................... | G02B 6/0085 349/65 |
| 2013/0128189 A1* | 5/2013 | Hu | ....................... | G02B 6/0031 349/65 |
| 2013/0201421 A1* | 8/2013 | Yu | ..................... | G02F 1/133308 349/58 |
| 2013/0278857 A1* | 10/2013 | Zeng | .................... | G02B 6/0085 349/58 |

(Continued)

*Primary Examiner* — Joseph L Williams
*Assistant Examiner* — Jose M Diaz
(74) *Attorney, Agent, or Firm* — Brooks Kushman P.C.

(57) ABSTRACT

The present disclosure provides a backlight module and a liquid crystal display device, and the backlight module includes a back plate, a light guide plate and a light source. The back plate and the light guide plate are laminated. The back plate includes a mounting groove disposed at a first end of the back plate. The light source is arranged in the mounting groove. A light emergent surface of the light source faces a light incident surface of the light guide plate.

20 Claims, 2 Drawing Sheets

(56) References Cited

U.S. PATENT DOCUMENTS

| | | | |
|---|---|---|---|
| 2014/0226108 A1* | 8/2014 | Itakura | G02B 6/0021 349/65 |
| 2014/0362327 A1* | 12/2014 | Ohkubo | G02F 1/133308 349/58 |
| 2015/0293272 A1* | 10/2015 | Pham | G02B 5/0221 359/599 |
| 2016/0341874 A1* | 11/2016 | Fan | G02B 6/0091 |
| 2018/0046023 A1* | 2/2018 | Kim | G02B 6/0011 |
| 2019/0103051 A1* | 4/2019 | Yamamoto | G02B 6/00 |

* cited by examiner

BACKLIGHT MODULE AND LIQUID CRYSTAL DISPLAY DEVICE

CROSS-REFERENCE TO RELATED APPLICATION

This application claims priority to Chinese Patent Application No. 201820453224.1 filed on Apr. 2, 2018, which is incorporated herein by reference in its entirety.

TECHNICAL FIELD

The present disclosure relates to the field of display technologies, for example to a backlight module and a liquid crystal display device.

BACKGROUND

Due to its small volume, low power consumption and non-radiation characteristic, a liquid crystal display (LCD) has been a mainstream product among flat panel display devices. The liquid crystal display includes a liquid crystal display panel and a backlight module. The liquid crystal display panel includes an array substrate and a color filter substrate that are oppositely arranged to form a cell, and liquid crystals are located between the array substrate and the color filter substrate. The backlight module is configured to provide backlight for the liquid crystal display panel.

SUMMARY

A backlight module includes a back plate, a light guide plate and a light source. The back plate and the light guide plate are laminated. The back plate includes a mounting groove disposed at a first end of the back plate. The light source is arranged in the mounting groove, and a light emergent surface of the light source faces a light incident surface of the light guide plate.

In some embodiments, the light source includes chip-on-board packaged light emitting diodes.

In some embodiments, the light emergent surface of the light source is in contact with the light incident surface of the light guide plate.

In some embodiments, the light source includes a support member and a light emitting device, and the support member is located in the mounting groove, and the light emitting device and the support member are stacked.

In some embodiments, the backlight module further includes a light shielding member, and the light shielding member is disposed at one side of the light emitting device away from the support member.

In some embodiments, the light shielding member includes a first light shielding member and a second light shielding member, the first light shielding member is disposed at one side of the light emitting device away from the support member, and the second light shielding member is disposed at one side of the first light shielding member away from the light emitting device.

In some embodiments, the second light shielding member at least covers a side of the first light shielding member away from the light emitting device and an edge of the light guide plate adjacent to the light source.

In some embodiments, the backlight module further includes a flexible printed circuit board, the flexible printed circuit board is electrically connected with the light emitting device, and the flexible printed circuit board is disposed at one side of the support member away from the light emitting device.

In some embodiments, the backlight module further includes a diffusion film and a prism film, the diffusion film is disposed at one side of the light guide plate away from the back plate, and the prism film is disposed at one side of the diffusion film away from the back plate.

In some embodiments, the back plate and the support member are made of stainless steel or aluminum alloy.

In some embodiments, the backlight module further includes a reflective film disposed between the back plate and the light guide plate, and a reflective surface of the reflective film faces the light guide plate.

A liquid crystal display device includes a backlight module.

The backlight module includes a back plate, a light guide plate and a light source. The back plate and the light guide plate are laminated. The back plate includes a mounting groove disposed at a first end of the back plate. The light source is arranged in the mounting groove, and a light emergent surface of the light source faces a light incident surface of the light guide plate.

In some embodiments, the light source includes chip-on-board packaged light emitting diodes.

In some embodiments, the light emergent surface of the light source is in contact with the light incident surface of the light guide plate.

In some embodiments, the light source includes a support member and a light emitting device, the support member is located in the mounting groove, and the light emitting device and the support member are stacked.

In some embodiments, the backlight module further includes a light shielding member which is disposed at one side of the light emitting device away from the support member.

In some embodiments, the light shielding member includes a first light shielding member and a second light shielding member, the first light shielding member is disposed at one side of the light emitting device away from the support member, and the second light shielding member is disposed at one side of the first light shielding member away from the light emitting device.

In some embodiments, the second light shielding member at least covers a side of the first light shielding member away from the light emitting device and an edge of the light guide plate adjacent to the light source.

In some embodiments, the backlight module further includes a diffusion film and a prism film, the diffusion film is disposed at one side of the light guide plate away from the back plate, and the prism film is disposed at one side of the diffusion film away from the back plate.

BRIEF DESCRIPTION OF THE DRAWINGS

In order to explain the technical solutions in some embodiments of the present disclosure, drawings thereof are introduced in the following.

DETAILED DESCRIPTION

In a backlight module and a liquid crystal display device according to some embodiments of the present disclosure, a screen-to-body ratio of the liquid crystal display device is increased. A screen-to-body ratio is a ratio of an area of a screen of a liquid crystal device to an area of a panel of a liquid crystal device, and the panel consists of the screen and frame surrounding the screen.

Figure 1:
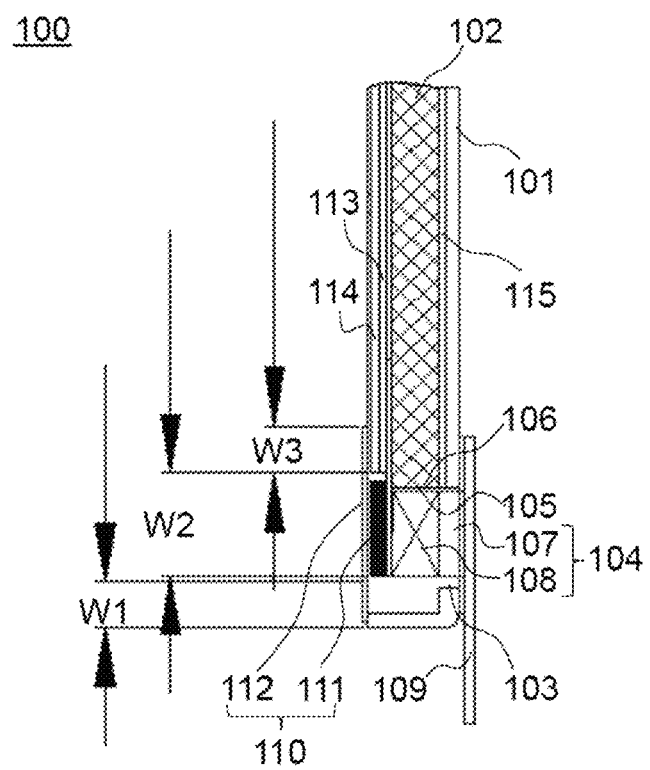
FIG. 1 is a sectional view of a backlight module according to some embodiments.

Some embodiments provide a backlight module 100. As shown in FIG. 1, the backlight module 100 includes a back plate 101, a light guide plate 102, a mounting groove 103 and a light source 104.

The back plate 101 and the light guide plate 102 are laminated.

Figure 2:
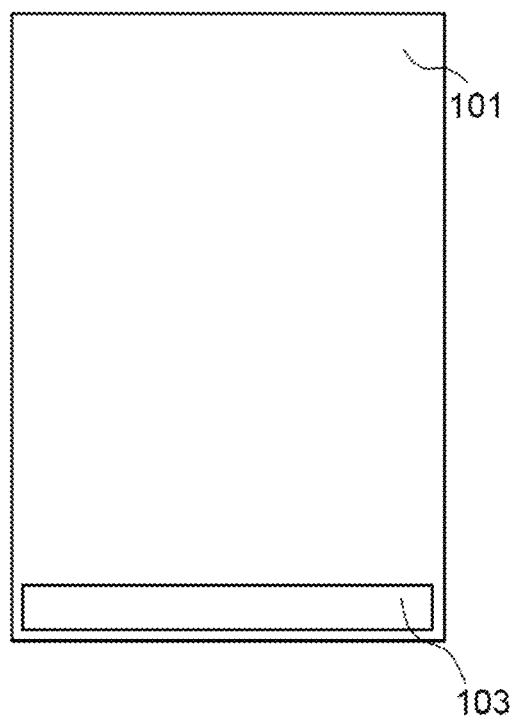
FIG. 2 is a top view of a back plate in the backlight module according to some embodiments.

FIG. 2 is a top view of the back plate 101. As shown in FIG. 2, the mounting groove 103 is disposed at a first end of the back plate 101.

As shown in FIG. 1, a light source 104 is arranged in the mounting groove 103, and the light emergent surface 105 of the light source 104 faces the light incident surface 106 of the light guide plate 102.

In the above embodiments, the back plate of the backlight module is provided with a mounting groove at the first end of the back plate, the light source is arranged in the mounting groove, and the light emergent surface of the light source faces the light incident surface of the light guide plate. Therefore, there is no need to provide a structure for carrying the light source on one side of the back plate facing the light guide plate. That is, it is no need providing a structure for carrying the light source between the light guide plate and the back plate, which reduces a distance between the back plate and the light guide plate. With the above arrangements, a width of a frame of the backlight module is reduced, and a screen-to-body ratio of the liquid crystal display device is increased.

In a process of assembling the backlight module, the light source is mounted in the mounting groove, and the light emergent surface of the light source is arrange facing the light incident surface of the light guide plate, which simplify the process of manufacturing the backlight module and the liquid crystal display device.

In some embodiments, the light source includes chip-on-board (COB) packaged light emitting diodes (LEDs).

COB packaged LEDs are formed by attaching LED chips on a mirror metal board with a high reflective rate by adopting high luminous efficacy and integrated surface light source technologies. For example, a plurality of semiconductor chips are attached on a printed circuit board, an electrical connections between the plurality of semiconductor chips and the printed circuit board are implemented by a wire stitching method, and the wire are covered by resin to ensure reliability.

In some embodiments, COB packaged LEDs are arranged intensively. For example, the number of the LEDs is greater than or equal to 28 and smaller than or equal to 32. A LED light bar including intensively arranged the above LEDs emits a light approximate to a linear light, and leads light intensity of the light incident on the light incident surface of the light guide plate to distribute uniformly, which avoids a hot spot.

In some embodiments, as shown in FIG. 1, the light emergent surface 105 of the light source 104 is in contact with the light incident surface 106 of the light guide plate 101.

In the above embodiments, the light emergent surface of the light source is in contact with the light incident surface of the light guide plate, which reduces a width of frames of the liquid crystal display device, increases a light utilization efficiency of the light guide plate, and reduces light consumption.

In some embodiments, as shown in FIG. 1, the light source 104 includes a support member 107 and a light emitting device 108, where the support member 107 is located in the mounting groove 103, and the light emitting device 108 and the support member 107 are stacked.

In some embodiments, a thickness of the support member 107 in a depth direction of the mounting groove 103 is greater than or equal to a depth of the mounting groove 103 (the mounting groove 103 has a depth equal to the thickness of the back plate 103), such that a light emitting surface of the light emitting device 108 is entirely located outside the mounting groove 103, for all light emitted from the light emergent surface of the light emitting device 108 to go into the light incident surface of the light guide plate.

In some embodiments, the support member 107 is a flexible printed circuit (FPC).

In some embodiments, the light emitting device 108 is attached on the surface of the support member 107 by an adhesive strip.

In some embodiments, as shown in FIG. 1, the backlight module 100 further includes a light shielding member 110, where the light shielding member 110 is disposed at one side of the light emitting device 108 away from the support member 107.

The light shielding member may shield the light emitted from the side of the light emitting device (that is, one side of the light emitting device away from the support member), thereby eliminating edge light leakage of the liquid crystal display device.

In some embodiments, as shown in FIG. 1, the light shielding member 110 includes a first light shielding member 111, where the first light shielding member 111 is disposed at one side of the light emitting device 108 away from the support member 107.

In some embodiments, the light shielding member 110 includes a first light shielding member 111 and a second light shielding member 112, where the first light shielding member 111 is disposed at one side of the light emitting device 108 away from the support member 107, and the second light shielding member 112 is disposed at one side of the first light shielding member 111 away from the light emitting device 108. The second light shielding member 112 at least covers a side of the first light shielding member 111 away from the light emitting device 108 and an edge of the light guide plate 102 adjacent to the light source 104.

In some embodiments, the first light shielding member 111 and the second light shielding member 112 are both light shielding tapes.

In some embodiments, as shown in FIG. 1, the backlight module 100 further includes a diffusion film 113 and a prism film 114, where the diffusion film 113 is disposed at one side of the light guide plate 102 away from the back plate 101, and the prism film 114 is disposed at one side of the diffusion film 113 away from the back plate 101.

The above diffusion film increases the light diffusion. The prism film makes all the light beams emitted from the backlight module have a same direction.

In some embodiments, as shown in FIG. 1, the backlight module 100 further includes a flexible printed circuit board 109, where the flexible printed circuit board 109 is electrically connected with the light emitting device 108, and the flexible printed circuit board 109 is disposed at one side of the support member 107 away from the light emitting device 108.

Such arrangements facilitate mounting the light source from one side of the back plate away from the light guide plate, thereby simplifying the structure and assembly of the backlight module.

In some embodiments, the back plate and the support member are made of stainless steel or aluminum alloy.

The back plate and the support member made of stainless steel or aluminum alloy increases structure strength of the backlight module and improves heat dissipation capability of the backlight module.

In some embodiments, as shown in FIG. 1, the backlight module 100 further includes a reflective film 115 disposed between the back plate 101 and the light guide plate 102. The reflective film 115 has a reflective surface facing the light guide plate 102.

With the reflective film, the light utilization efficiency of the light guide plate is increased.

In some embodiments, a frame width of the first end of the backlight module is equal to a sum of an edge width W1 of the back plate below the mounting groove, a light source width W2, and a width W3 of the second light shielding member exceeding the prism film 114. Therefore, with the backlight module according to the above embodiments, the light source mounting structure of the backlight module is simplified, and the frame width of the first end of the backlight module is reduced.

Figure 3:
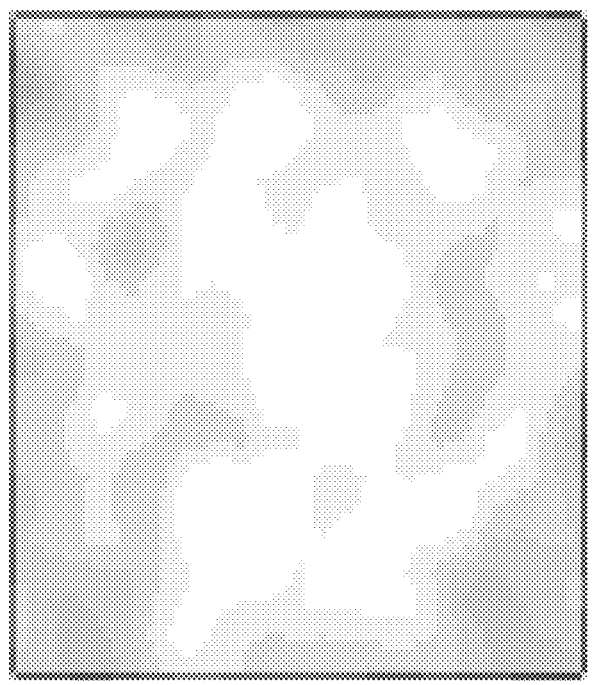
FIG. 3 is an optical effect schematic diagram of the backlight module according to some embodiments.

FIG. 3 is an optical effect schematic diagram of the backlight module according to some embodiments. The optical effects achieved by this backlight module may satisfy the design requirements of the backlight module. As shown in FIG. 3, different gray level represents different brightness. The larger the value of gray level, the bigger the value of brightness. The lower the value of gray level, the smaller the value of brightness. As is known from the FIG. 3, the brightness of the whole picture is uniform, which satisfies the design requirements of the backlight module.

Some embodiments further provide a liquid crystal display device. The liquid crystal display device includes any one of the backlight modules according to the above embodiments.

In the above embodiments, the back plate of the backlight module is provided with a mounting groove at a first end of the back plate, and the light emergent surface of the light source faces the light incident surface of the light guide plate. Therefore, there is no need to provide a structure for carrying the light source on one side of the back plate facing the light guide plate, which reduces the distance between the first end of the back plate and the light guide plate. The frame width of the first end of the backlight module in the liquid crystal display device according to the above embodiments is reduced, and the screen-to-body ratio of the liquid crystal display device is increased. With the mounting groove, in a process of assembling the backlight module, the light source is mounted in the mounting groove, and the light emergent surface of the light source faces the light incident surface of the light guide plate, which simplify the assembly of the backlight module and the liquid crystal display device.

What is claimed is:

1. A backlight module, comprising:
   a back plate;
   a light guide plate; and
   a light source;
   wherein the back plate and the light guide plate are laminated, the back plate comprises a mounting groove disposed at a first end of the back plate, the light source is arranged in the mounting groove, and a light emergent surface of the light source faces a light incident surface of the light guide plate; and a projection of the light guide plate on the back plate is outside of a projection of the mounting groove on the back plate.

2. The backlight module according to claim 1, wherein the light source comprises chip-on-board packaged light emitting diodes.

3. The backlight module according to claim 1, wherein the light emergent surface of the light source is in contact with the light incident surface of the light guide plate.

4. The backlight module according to claim 1, wherein the light source comprises a support member and a light emitting device, and wherein the support member is located in the mounting groove, and the light emitting device and the support member are stacked.

5. The backlight module according to claim 4, further comprising:
   a light shielding member,
   wherein the light shielding member is disposed at one side of the light emitting device away from the support member.

6. The backlight module according to claim 5, wherein the light shielding member comprises a first light shielding member and a second light shielding member, wherein the first light shielding member is disposed at one side of the light emitting device away from the support member, and the second light shielding member is disposed at one side of the first light shielding member away from the light emitting device.

7. The backlight module according to claim 6, wherein the second light shielding member at least covers a side of the first light shielding member away from the light emitting device and an edge of the light guide plate adjacent to the light source.

8. The backlight module according to claim 4, further comprising:
   a flexible printed circuit board,
   wherein the flexible printed circuit board is electrically connected with the light emitting device, and the flexible printed circuit board is disposed at one side of the support member away from the light emitting device.

9. The backlight module according to claim 1, further comprising:
   a diffusion film; and
   a prism film;
   wherein the diffusion film is disposed at one side of the light guide plate away from the back plate, and the prism film is disposed at one side of the diffusion film away from the back plate.

10. The backlight module according to claim 1, wherein the back plate and the support member are made of stainless steel or aluminum alloy.

11. The backlight module according to claim 1, further comprising:
    a reflective film disposed between the back plate and the light guide plate,
    wherein a reflective surface of the reflective film faces the light guide plate.

12. A liquid crystal display device comprising a backlight module,
    wherein the backlight module comprises a back plate, a light guide plate and a light source, the back plate and the light guide plate are laminated, the back plate comprises a mounting groove disposed at a first end of the back plate, the light source is arranged in the mounting groove, and a light emergent surface of the light source faces a light incident surface of the light guide plate; and a projection of the light guide plate on the back plate is outside of a projection of the mounting groove on the back plate.

13. The liquid crystal display device according to claim 12, wherein the light source comprises chip-on-board packaged light emitting diodes.

14. The liquid crystal display device according to claim 12, wherein the light emergent surface of the light source is in contact with the light incident surface of the light guide plate.

15. The liquid crystal display device according to claim 12, wherein the light source comprises a support member and a light emitting device, wherein the support member is located in the mounting groove, and the light emitting device and the support member are stacked.

16. The liquid crystal display device according to claim 15, wherein the backlight module further comprises a light shielding member which is disposed at one side of the light emitting device away from the support member.

17. The liquid crystal display device according to claim 16, wherein the light shielding member comprises a first light shielding member and a second light shielding member, wherein the first light shielding member is disposed at one side of the light emitting device away from the support member, and the second light shielding member is disposed at one side of the first light shielding member away from the light emitting device.

18. The liquid crystal display device according to claim 17, wherein the second light shielding member at least covers a side of the first light shielding member away from the light emitting device and an edge of the light guide plate adjacent to the light source.

19. The liquid crystal display device according to claim 12, wherein the backlight module further comprises a diffusion film and a prism film, wherein the diffusion film is disposed at one side of the light guide plate away from the back plate, and the prism film is disposed at one side of the diffusion film away from the back plate.

20. The backlight module according to claim 1, wherein the mounting groove is a through hole formed in the back plate.

* * * * *